United States Patent
Hoidn

(10) Patent No.: US 9,021,410 B1
(45) Date of Patent: Apr. 28, 2015

(54) ELECTRONIC SYSTEM WITH MULTI-CYCLE SIMULATION COVERAGE MECHANISM AND METHOD OF OPERATION THEREOF

(71) Applicant: Western Digital Technologies, Inc., Irvine, CA (US)

(72) Inventor: Markus J. Hoidn, Longmont, CO (US)

(73) Assignee: Western Technologies, Inc., Irvine, CA (US)

( * ) Notice: Subject to any disclaimer, the term of this patent is extended or adjusted under 35 U.S.C. 154(b) by 0 days.

(21) Appl. No.: 14/182,628

(22) Filed: Feb. 18, 2014

Related U.S. Application Data

(60) Provisional application No. 61/914,077, filed on Dec. 10, 2013.

(51) Int. Cl.
*G06F 17/50* (2006.01)

(52) U.S. Cl.
CPC .................................. *G06F 17/5031* (2013.01)

(58) Field of Classification Search
CPC ................................. G06F 17/30; G06F 17/50
USPC .......................................................... 716/108
See application file for complete search history.

(56) References Cited

U.S. PATENT DOCUMENTS

| | | | |
|---|---|---|---|
| 5,650,938 A | 7/1997 | Bootehsaz et al. | |
| 6,018,789 A | 1/2000 | Sokolov et al. | |
| 6,065,095 A | 5/2000 | Sokolov et al. | |
| 6,078,452 A | 6/2000 | Kittilson et al. | |
| 6,081,447 A | 6/2000 | Lofgren et al. | |
| 6,092,149 A | 7/2000 | Hicken et al. | |
| 6,092,150 A | 7/2000 | Sokolov et al. | |
| 6,094,707 A | 7/2000 | Sokolov et al. | |
| 6,105,104 A | 8/2000 | Guttmann et al. | |
| 6,111,717 A | 8/2000 | Cloke et al. | |
| 6,145,052 A | 11/2000 | Howe et al. | |
| 6,175,893 B1 | 1/2001 | D'Souza et al. | |
| 6,178,056 B1 | 1/2001 | Cloke et al. | |
| 6,191,909 B1 | 2/2001 | Cloke et al. | |
| 6,195,218 B1 | 2/2001 | Guttmann et al. | |
| 6,205,494 B1 | 3/2001 | Williams | |
| 6,208,477 B1 | 3/2001 | Cloke et al. | |
| 6,223,303 B1 | 4/2001 | Billings et al. | |
| 6,230,233 B1 | 5/2001 | Lofgren et al. | |
| 6,246,346 B1 | 6/2001 | Cloke et al. | |
| 6,249,393 B1 | 6/2001 | Billings et al. | |
| 6,256,695 B1 | 7/2001 | Williams | |
| 6,262,857 B1 | 7/2001 | Hull et al. | |
| 6,263,459 B1 | 7/2001 | Schibilla | |
| 6,272,694 B1 | 8/2001 | Weaver et al. | |
| 6,278,568 B1 | 8/2001 | Cloke et al. | |
| 6,279,089 B1 | 8/2001 | Schibilla et al. | |
| 6,289,484 B1 | 9/2001 | Rothberg et al. | |
| 6,292,912 B1 | 9/2001 | Cloke et al. | |
| 6,310,740 B1 | 10/2001 | Dunbar et al. | |
| 6,317,850 B1 | 11/2001 | Rothberg | |
| 6,327,106 B1 | 12/2001 | Rothberg | |
| 6,337,778 B1 | 1/2002 | Gagne | |
| 6,369,969 B1 | 4/2002 | Christiansen et al. | |

(Continued)

*Primary Examiner* — Vuthe Siek
*Assistant Examiner* — Mohammed Alam

(57) ABSTRACT

An apparatus includes: a storage unit configured to provide a device design; a control unit configured to analyze the device design for a multi-cycle exception, generate a multi-cycle exception profile, and generate a checker based on the multi-cycle exception profile for a test bench for a simulation version of the device design.

30 Claims, 5 Drawing Sheets

(56) References Cited

U.S. PATENT DOCUMENTS

| | | |
|---|---|---|
| 6,384,999 B1 | 5/2002 | Schibilla |
| 6,388,833 B1 | 5/2002 | Golowka et al. |
| 6,405,342 B1 | 6/2002 | Lee |
| 6,408,357 B1 | 6/2002 | Hanmann et al. |
| 6,408,406 B1 | 6/2002 | Parris |
| 6,411,452 B1 | 6/2002 | Cloke |
| 6,411,458 B1 | 6/2002 | Billings et al. |
| 6,412,083 B1 | 6/2002 | Rothberg et al. |
| 6,415,349 B1 | 7/2002 | Hull et al. |
| 6,425,128 B1 | 7/2002 | Krapf et al. |
| 6,441,981 B1 | 8/2002 | Cloke et al. |
| 6,442,328 B1 | 8/2002 | Elliott et al. |
| 6,445,524 B1 | 9/2002 | Nazarian et al. |
| 6,449,767 B1 | 9/2002 | Krapf et al. |
| 6,453,115 B1 | 9/2002 | Boyle |
| 6,470,420 B1 | 10/2002 | Hospodor |
| 6,480,020 B1 | 11/2002 | Jung et al. |
| 6,480,349 B1 | 11/2002 | Kim et al. |
| 6,480,932 B1 | 11/2002 | Vallis et al. |
| 6,483,986 B1 | 11/2002 | Krapf |
| 6,487,032 B1 | 11/2002 | Cloke et al. |
| 6,490,635 B1 | 12/2002 | Holmes |
| 6,493,173 B1 | 12/2002 | Kim et al. |
| 6,499,083 B1 | 12/2002 | Hamlin |
| 6,519,104 B1 | 2/2003 | Cloke et al. |
| 6,525,892 B1 | 2/2003 | Dunbar et al. |
| 6,545,830 B1 | 4/2003 | Briggs et al. |
| 6,546,489 B1 | 4/2003 | Frank, Jr. et al. |
| 6,550,021 B1 | 4/2003 | Dalphy et al. |
| 6,552,880 B1 | 4/2003 | Dunbar et al. |
| 6,553,457 B1 | 4/2003 | Wilkins et al. |
| 6,578,106 B1 | 6/2003 | Price |
| 6,580,573 B1 | 6/2003 | Hull et al. |
| 6,594,183 B1 | 7/2003 | Lofgren et al. |
| 6,600,620 B1 | 7/2003 | Krounbi et al. |
| 6,601,137 B1 | 7/2003 | Castro et al. |
| 6,603,622 B1 | 8/2003 | Christiansen et al. |
| 6,603,625 B1 | 8/2003 | Hospodor et al. |
| 6,604,220 B1 | 8/2003 | Lee |
| 6,606,682 B1 | 8/2003 | Dang et al. |
| 6,606,714 B1 | 8/2003 | Thelin |
| 6,606,717 B1 | 8/2003 | Yu et al. |
| 6,611,393 B1 | 8/2003 | Nguyen et al. |
| 6,615,312 B1 | 9/2003 | Hamlin et al. |
| 6,639,748 B1 | 10/2003 | Christiansen et al. |
| 6,647,481 B1 | 11/2003 | Luu et al. |
| 6,654,193 B1 | 11/2003 | Thelin |
| 6,657,810 B1 | 12/2003 | Kupferman |
| 6,661,591 B1 | 12/2003 | Rothberg |
| 6,665,772 B1 | 12/2003 | Hamlin |
| 6,687,073 B1 | 2/2004 | Kupferman |
| 6,687,078 B1 | 2/2004 | Kim |
| 6,687,850 B1 | 2/2004 | Rothberg |
| 6,690,523 B1 | 2/2004 | Nguyen et al. |
| 6,690,882 B1 | 2/2004 | Hanmann et al. |
| 6,691,198 B1 | 2/2004 | Hamlin |
| 6,691,213 B1 | 2/2004 | Luu et al. |
| 6,691,255 B1 | 2/2004 | Rothberg et al. |
| 6,693,760 B1 | 2/2004 | Krounbi et al. |
| 6,694,477 B1 | 2/2004 | Lee |
| 6,697,914 B1 | 2/2004 | Hospodor et al. |
| 6,704,153 B1 | 3/2004 | Rothberg et al. |
| 6,708,251 B1 | 3/2004 | Boyle et al. |
| 6,710,951 B1 | 3/2004 | Cloke |
| 6,711,628 B1 | 3/2004 | Thelin |
| 6,711,635 B1 | 3/2004 | Wang |
| 6,711,660 B1 | 3/2004 | Milne et al. |
| 6,715,044 B2 | 3/2004 | Lofgren et al. |
| 6,724,982 B1 | 4/2004 | Hamlin |
| 6,725,329 B1 | 4/2004 | Ng et al. |
| 6,735,650 B1 | 5/2004 | Rothberg |
| 6,735,693 B1 | 5/2004 | Hamlin |
| 6,744,772 B1 | 6/2004 | Eneboe et al. |
| 6,745,283 B1 | 6/2004 | Dang |
| 6,751,402 B1 | 6/2004 | Elliott et al. |
| 6,757,481 B1 | 6/2004 | Nazarian et al. |
| 6,772,281 B2 | 8/2004 | Hamlin |
| 6,781,826 B1 | 8/2004 | Goldstone et al. |
| 6,782,449 B1 | 8/2004 | Codilian et al. |
| 6,791,779 B1 | 9/2004 | Singh et al. |
| 6,792,486 B1 | 9/2004 | Hanan et al. |
| 6,799,274 B1 | 9/2004 | Hamlin |
| 6,811,427 B2 | 11/2004 | Garrett et al. |
| 6,826,003 B1 | 11/2004 | Subrahmanyam |
| 6,826,614 B1 | 11/2004 | Hanmann et al. |
| 6,832,041 B1 | 12/2004 | Boyle |
| 6,832,929 B2 | 12/2004 | Garrett et al. |
| 6,845,405 B1 | 1/2005 | Thelin |
| 6,845,427 B1 | 1/2005 | Atai-Azimi |
| 6,850,443 B2 | 2/2005 | Lofgren et al. |
| 6,851,055 B1 | 2/2005 | Boyle et al. |
| 6,851,063 B1 | 2/2005 | Boyle et al. |
| 6,853,731 B1 | 2/2005 | Boyle et al. |
| 6,854,022 B1 | 2/2005 | Thelin |
| 6,862,660 B1 | 3/2005 | Wilkins et al. |
| 6,880,043 B1 | 4/2005 | Castro et al. |
| 6,882,486 B1 | 4/2005 | Kupferman |
| 6,884,085 B1 | 4/2005 | Goldstone |
| 6,888,831 B1 | 5/2005 | Hospodor et al. |
| 6,892,217 B1 | 5/2005 | Hanmann et al. |
| 6,892,249 B1 | 5/2005 | Codilian et al. |
| 6,892,313 B1 | 5/2005 | Codilian et al. |
| 6,895,455 B1 | 5/2005 | Rothberg |
| 6,895,500 B1 | 5/2005 | Rothberg |
| 6,898,730 B1 | 5/2005 | Hanan |
| 6,910,099 B1 | 6/2005 | Wang et al. |
| 6,928,470 B1 | 8/2005 | Hamlin |
| 6,931,439 B1 | 8/2005 | Hanmann et al. |
| 6,934,104 B1 | 8/2005 | Kupferman |
| 6,934,713 B2 | 8/2005 | Schwartz et al. |
| 6,940,873 B2 | 9/2005 | Boyle et al. |
| 6,943,978 B1 | 9/2005 | Lee |
| 6,948,165 B1 | 9/2005 | Luu et al. |
| 6,950,267 B1 | 9/2005 | Liu et al. |
| 6,954,733 B1 | 10/2005 | Ellis et al. |
| 6,961,814 B1 | 11/2005 | Thelin et al. |
| 6,964,027 B2 | 11/2005 | Kucukcakar et al. |
| 6,965,489 B1 | 11/2005 | Lee et al. |
| 6,965,563 B1 | 11/2005 | Hospodor et al. |
| 6,965,966 B1 | 11/2005 | Rothberg et al. |
| 6,967,799 B1 | 11/2005 | Lee |
| 6,968,422 B1 | 11/2005 | Codilian et al. |
| 6,968,450 B1 | 11/2005 | Rothberg et al. |
| 6,973,495 B1 | 12/2005 | Milne et al. |
| 6,973,570 B1 | 12/2005 | Hamlin |
| 6,976,190 B1 | 12/2005 | Goldstone |
| 6,983,316 B1 | 1/2006 | Milne et al. |
| 6,986,007 B1 | 1/2006 | Procyk et al. |
| 6,986,154 B1 | 1/2006 | Price et al. |
| 6,995,933 B1 | 2/2006 | Codilian et al. |
| 6,996,501 B1 | 2/2006 | Rothberg |
| 6,996,669 B1 | 2/2006 | Dang et al. |
| 7,002,926 B1 | 2/2006 | Eneboe et al. |
| 7,003,674 B1 | 2/2006 | Hamlin |
| 7,006,316 B1 | 2/2006 | Sargenti, Jr. et al. |
| 7,009,820 B1 | 3/2006 | Hogg |
| 7,023,639 B1 | 4/2006 | Kupferman |
| 7,024,491 B1 | 4/2006 | Hanmann et al. |
| 7,024,549 B1 | 4/2006 | Luu et al. |
| 7,024,614 B1 | 4/2006 | Thelin et al. |
| 7,027,716 B1 | 4/2006 | Boyle et al. |
| 7,028,174 B1 | 4/2006 | Atai-Azimi et al. |
| 7,031,902 B1 | 4/2006 | Catiller |
| 7,046,465 B1 | 5/2006 | Kupferman |
| 7,046,488 B1 | 5/2006 | Hogg |
| 7,050,252 B1 | 5/2006 | Vallis |
| 7,054,937 B1 | 5/2006 | Milne et al. |
| 7,055,000 B1 | 5/2006 | Severtson |
| 7,055,167 B1 | 5/2006 | Masters |
| 7,057,836 B1 | 6/2006 | Kupferman |
| 7,062,398 B1 | 6/2006 | Rothberg |
| 7,075,746 B1 | 7/2006 | Kupferman |
| 7,076,604 B1 | 7/2006 | Thelin |
| 7,082,494 B1 | 7/2006 | Thelin et al. |

(56) References Cited

U.S. PATENT DOCUMENTS

| | | |
|---|---|---|
| 7,088,538 B1 | 8/2006 | Codilian et al. |
| 7,088,545 B1 | 8/2006 | Singh et al. |
| 7,092,186 B1 | 8/2006 | Hogg |
| 7,095,577 B1 | 8/2006 | Codilian et al. |
| 7,099,095 B1 | 8/2006 | Subrahmanyam et al. |
| 7,106,537 B1 | 9/2006 | Bennett |
| 7,106,947 B2 | 9/2006 | Boyle et al. |
| 7,110,202 B1 | 9/2006 | Vasquez |
| 7,111,116 B1 | 9/2006 | Boyle et al. |
| 7,114,029 B1 | 9/2006 | Thelin |
| 7,120,737 B1 | 10/2006 | Thelin |
| 7,120,806 B1 | 10/2006 | Codilian et al. |
| 7,126,776 B1 | 10/2006 | Warren, Jr. et al. |
| 7,129,763 B1 | 10/2006 | Bennett et al. |
| 7,133,600 B1 | 11/2006 | Boyle |
| 7,136,244 B1 | 11/2006 | Rothberg |
| 7,146,094 B1 | 12/2006 | Boyle |
| 7,149,046 B1 | 12/2006 | Coker et al. |
| 7,150,036 B1 | 12/2006 | Milne et al. |
| 7,155,616 B1 | 12/2006 | Hamlin |
| 7,171,108 B1 | 1/2007 | Masters et al. |
| 7,171,110 B1 | 1/2007 | Wilshire |
| 7,194,576 B1 | 3/2007 | Boyle |
| 7,200,698 B1 | 4/2007 | Rothberg |
| 7,205,805 B1 | 4/2007 | Bennett |
| 7,206,497 B1 | 4/2007 | Boyle et al. |
| 7,215,496 B1 | 5/2007 | Kupferman et al. |
| 7,215,771 B1 | 5/2007 | Hamlin |
| 7,237,054 B1 | 6/2007 | Cain et al. |
| 7,240,161 B1 | 7/2007 | Boyle |
| 7,249,365 B1 | 7/2007 | Price et al. |
| 7,263,709 B1 | 8/2007 | Krapf |
| 7,274,639 B1 | 9/2007 | Codilian et al. |
| 7,274,659 B2 | 9/2007 | Hospodor |
| 7,275,116 B1 | 9/2007 | Hanmann et al. |
| 7,280,302 B1 | 10/2007 | Masiewicz |
| 7,292,774 B1 | 11/2007 | Masters et al. |
| 7,292,775 B1 | 11/2007 | Boyle et al. |
| 7,296,284 B1 | 11/2007 | Price et al. |
| 7,302,501 B1 | 11/2007 | Cain et al. |
| 7,302,579 B1 | 11/2007 | Cain et al. |
| 7,318,088 B1 | 1/2008 | Mann |
| 7,319,806 B1 | 1/2008 | Willner et al. |
| 7,325,244 B2 | 1/2008 | Boyle et al. |
| 7,330,323 B1 | 2/2008 | Singh et al. |
| 7,346,790 B1 | 3/2008 | Klein |
| 7,366,641 B1 | 4/2008 | Masiewicz et al. |
| 7,369,340 B1 | 5/2008 | Dang et al. |
| 7,369,343 B1 | 5/2008 | Yeo et al. |
| 7,372,650 B1 | 5/2008 | Kupferman |
| 7,380,147 B1 | 5/2008 | Sun |
| 7,392,340 B1 | 6/2008 | Dang et al. |
| 7,404,013 B1 | 7/2008 | Masiewicz |
| 7,406,545 B1 | 7/2008 | Rothberg et al. |
| 7,415,571 B1 | 8/2008 | Hanan |
| 7,436,610 B1 | 10/2008 | Thelin |
| 7,437,502 B1 | 10/2008 | Coker |
| 7,440,214 B1 | 10/2008 | Ell et al. |
| 7,451,344 B1 | 11/2008 | Rothberg |
| 7,471,483 B1 | 12/2008 | Ferris et al. |
| 7,471,486 B1 | 12/2008 | Coker et al. |
| 7,486,060 B1 | 2/2009 | Bennett |
| 7,496,493 B1 | 2/2009 | Stevens |
| 7,518,819 B1 | 4/2009 | Yu et al. |
| 7,526,184 B1 | 4/2009 | Parkinen et al. |
| 7,539,924 B1 | 5/2009 | Vasquez et al. |
| 7,543,117 B1 | 6/2009 | Hanan |
| 7,551,383 B1 | 6/2009 | Kupferman |
| 7,562,282 B1 | 7/2009 | Rothberg |
| 7,577,973 B1 | 8/2009 | Kapner, III et al. |
| 7,596,797 B1 | 9/2009 | Kapner, III et al. |
| 7,599,139 B1 | 10/2009 | Bombet et al. |
| 7,619,841 B1 | 11/2009 | Kupferman |
| 7,647,544 B1 | 1/2010 | Masiewicz |
| 7,649,704 B1 | 1/2010 | Bombet et al. |
| 7,653,927 B1 | 1/2010 | Kapner, III et al. |
| 7,656,603 B1 | 2/2010 | Xing |
| 7,656,763 B1 | 2/2010 | Jin et al. |
| 7,657,149 B2 | 2/2010 | Boyle |
| 7,672,072 B1 | 3/2010 | Boyle et al. |
| 7,673,075 B1 | 3/2010 | Masiewicz |
| 7,688,540 B1 | 3/2010 | Mei et al. |
| 7,724,461 B1 | 5/2010 | McFadyen et al. |
| 7,725,584 B1 | 5/2010 | Hanmann et al. |
| 7,730,295 B1 | 6/2010 | Lee |
| 7,760,458 B1 | 7/2010 | Trinh |
| 7,768,776 B1 | 8/2010 | Szeremeta et al. |
| 7,804,657 B1 | 9/2010 | Hogg et al. |
| 7,813,954 B1 | 10/2010 | Price et al. |
| 7,827,320 B1 | 11/2010 | Stevens |
| 7,839,588 B1 | 11/2010 | Dang et al. |
| 7,843,660 B1 | 11/2010 | Yeo |
| 7,852,596 B2 | 12/2010 | Boyle et al. |
| 7,859,782 B1 | 12/2010 | Lee |
| 7,872,822 B1 | 1/2011 | Rothberg |
| 7,898,756 B1 | 3/2011 | Wang |
| 7,898,762 B1 | 3/2011 | Guo et al. |
| 7,900,037 B1 | 3/2011 | Fallone et al. |
| 7,907,364 B2 | 3/2011 | Boyle et al. |
| 7,929,234 B1 | 4/2011 | Boyle et al. |
| 7,933,087 B1 | 4/2011 | Tsai et al. |
| 7,933,090 B1 | 4/2011 | Jung et al. |
| 7,934,030 B1 | 4/2011 | Sargenti, Jr. et al. |
| 7,940,491 B2 | 5/2011 | Szeremeta et al. |
| 7,944,639 B1 | 5/2011 | Wang |
| 7,945,727 B2 | 5/2011 | Rothberg et al. |
| 7,949,564 B1 | 5/2011 | Hughes et al. |
| 7,974,029 B2 | 7/2011 | Tsai et al. |
| 7,974,039 B1 | 7/2011 | Xu et al. |
| 7,982,993 B1 | 7/2011 | Tsai et al. |
| 7,984,200 B1 | 7/2011 | Bombet et al. |
| 7,984,354 B2 | 7/2011 | Goswami et al. |
| 7,990,648 B1 | 8/2011 | Wang |
| 7,992,179 B1 | 8/2011 | Kapner, III et al. |
| 8,004,785 B1 | 8/2011 | Tsai et al. |
| 8,006,027 B1 | 8/2011 | Stevens et al. |
| 8,014,094 B1 | 9/2011 | Jin |
| 8,014,977 B1 | 9/2011 | Masiewicz et al. |
| 8,019,914 B1 | 9/2011 | Vasquez et al. |
| 8,040,625 B1 | 10/2011 | Boyle et al. |
| 8,078,943 B1 | 12/2011 | Lee |
| 8,079,045 B2 | 12/2011 | Krapf et al. |
| 8,082,433 B1 | 12/2011 | Fallone et al. |
| 8,085,487 B1 | 12/2011 | Jung et al. |
| 8,089,719 B1 | 1/2012 | Dakroub |
| 8,090,902 B1 | 1/2012 | Bennett et al. |
| 8,090,906 B1 | 1/2012 | Blaha et al. |
| 8,091,112 B1 | 1/2012 | Elliott et al. |
| 8,094,396 B1 | 1/2012 | Zhang et al. |
| 8,094,401 B1 | 1/2012 | Peng et al. |
| 8,116,020 B1 | 2/2012 | Lee |
| 8,116,025 B1 | 2/2012 | Chan et al. |
| 8,134,793 B1 | 3/2012 | Vasquez et al. |
| 8,134,798 B1 | 3/2012 | Thelin et al. |
| 8,139,301 B1 | 3/2012 | Li et al. |
| 8,139,310 B1 | 3/2012 | Hogg |
| 8,144,419 B1 | 3/2012 | Liu |
| 8,145,452 B1 | 3/2012 | Masiewicz et al. |
| 8,149,528 B1 | 4/2012 | Suratman et al. |
| 8,154,812 B1 | 4/2012 | Boyle et al. |
| 8,159,768 B1 | 4/2012 | Miyamura |
| 8,161,328 B1 | 4/2012 | Wilshire |
| 8,164,849 B1 | 4/2012 | Szeremeta et al. |
| 8,174,780 B1 | 5/2012 | Tsai et al. |
| 8,190,575 B1 | 5/2012 | Ong et al. |
| 8,194,338 B1 | 6/2012 | Zhang |
| 8,194,340 B1 | 6/2012 | Boyle et al. |
| 8,194,341 B1 | 6/2012 | Boyle |
| 8,201,066 B1 | 6/2012 | Wang |
| 8,261,220 B2 | 9/2012 | Wu et al. |
| 8,271,692 B1 | 9/2012 | Dinh et al. |
| 8,279,550 B1 | 10/2012 | Hogg |
| 8,281,218 B1 | 10/2012 | Ybarra et al. |
| 8,285,923 B2 | 10/2012 | Stevens |

(56) References Cited

U.S. PATENT DOCUMENTS

| | | |
|---|---|---|
| 8,289,656 B1 | 10/2012 | Huber |
| 8,305,705 B1 | 11/2012 | Roohr |
| 8,307,156 B1 | 11/2012 | Codilian et al. |
| 8,310,775 B1 | 11/2012 | Boguslawski et al. |
| 8,315,006 B1 | 11/2012 | Chahwan et al. |
| 8,316,263 B1 | 11/2012 | Gough et al. |
| 8,320,067 B1 | 11/2012 | Tsai et al. |
| 8,324,974 B1 | 12/2012 | Bennett |
| 8,332,695 B2 | 12/2012 | Dalphy et al. |
| 8,341,337 B1 | 12/2012 | Ong et al. |
| 8,350,628 B1 | 1/2013 | Bennett |
| 8,356,184 B1 | 1/2013 | Meyer et al. |
| 8,370,683 B1 | 2/2013 | Ryan et al. |
| 8,375,225 B1 | 2/2013 | Ybarra |
| 8,375,274 B1 | 2/2013 | Bonke |
| 8,380,922 B1 | 2/2013 | DeForest et al. |
| 8,390,948 B2 | 3/2013 | Hogg |
| 8,390,952 B1 | 3/2013 | Szeremeta |
| 8,392,689 B1 | 3/2013 | Lott |
| 8,407,393 B1 | 3/2013 | Yolar et al. |
| 8,413,010 B1 | 4/2013 | Vasquez et al. |
| 8,417,566 B2 | 4/2013 | Price et al. |
| 8,421,663 B1 | 4/2013 | Bennett |
| 8,422,172 B1 | 4/2013 | Dakroub et al. |
| 8,427,771 B1 | 4/2013 | Tsai |
| 8,429,343 B1 | 4/2013 | Tsai |
| 8,433,937 B1 | 4/2013 | Wheelock et al. |
| 8,433,977 B1 | 4/2013 | Vasquez et al. |
| 8,458,526 B2 | 6/2013 | Dalphy et al. |
| 8,462,466 B2 | 6/2013 | Huber |
| 8,467,151 B1 | 6/2013 | Huber |
| 8,489,841 B1 | 7/2013 | Strecke et al. |
| 8,493,679 B1 | 7/2013 | Boguslawski et al. |
| 8,498,074 B1 | 7/2013 | Mobley et al. |
| 8,499,198 B1 | 7/2013 | Messenger et al. |
| 8,512,049 B1 | 8/2013 | Huber et al. |
| 8,514,506 B1 | 8/2013 | Li et al. |
| 8,531,791 B1 | 9/2013 | Reid et al. |
| 8,554,741 B1 | 10/2013 | Malina |
| 8,560,759 B1 | 10/2013 | Boyle et al. |
| 8,565,053 B1 | 10/2013 | Chung |
| 8,576,511 B1 | 11/2013 | Coker et al. |
| 8,578,100 B1 | 11/2013 | Huynh et al. |
| 8,578,242 B1 | 11/2013 | Burton et al. |
| 8,589,773 B1 | 11/2013 | Wang et al. |
| 8,593,753 B1 | 11/2013 | Anderson |
| 8,595,432 B1 | 11/2013 | Vinson et al. |
| 8,599,510 B1 | 12/2013 | Fallone |
| 8,601,248 B2 | 12/2013 | Thorsted |
| 8,611,032 B2 | 12/2013 | Champion et al. |
| 8,612,650 B1 | 12/2013 | Carrie et al. |
| 8,612,706 B1 | 12/2013 | Madril et al. |
| 8,612,798 B1 | 12/2013 | Tsai |
| 8,619,383 B1 | 12/2013 | Jung et al. |
| 8,621,115 B1 | 12/2013 | Bombet et al. |
| 8,621,133 B1 | 12/2013 | Boyle |
| 8,626,463 B2 | 1/2014 | Stevens et al. |
| 8,630,052 B1 | 1/2014 | Jung et al. |
| 8,630,056 B1 | 1/2014 | Ong |
| 8,631,188 B1 | 1/2014 | Heath et al. |
| 8,634,158 B1 | 1/2014 | Chahwan et al. |
| 8,635,412 B1 | 1/2014 | Wilshire |
| 8,640,007 B1 | 1/2014 | Schulze |
| 8,654,619 B1 | 2/2014 | Cheng |
| 8,661,193 B1 | 2/2014 | Cobos et al. |
| 8,667,248 B1 | 3/2014 | Neppalli |
| 8,670,205 B1 | 3/2014 | Malina et al. |
| 8,683,295 B1 | 3/2014 | Syu et al. |
| 8,683,457 B1 | 3/2014 | Hughes et al. |
| 8,687,306 B1 | 4/2014 | Coker et al. |
| 8,693,133 B1 | 4/2014 | Lee et al. |
| 8,694,841 B1 | 4/2014 | Chung et al. |
| 2006/0200785 A1* | 9/2006 | Borkovic et al. ............. 716/6 |
| 2008/0201671 A1 | 8/2008 | Rejouan et al. |
| 2009/0112552 A1* | 4/2009 | Behm et al. ............. 703/14 |
| 2009/0113702 A1 | 5/2009 | Hogg |
| 2010/0306551 A1 | 12/2010 | Meyer et al. |
| 2010/0316142 A1* | 12/2010 | Tsuchiya et al. ............. 375/259 |
| 2011/0226729 A1 | 9/2011 | Hogg |
| 2012/0159042 A1 | 6/2012 | Lott et al. |
| 2012/0221992 A1 | 8/2012 | Okabe |
| 2012/0275050 A1 | 11/2012 | Wilson et al. |
| 2012/0281963 A1 | 11/2012 | Krapf et al. |
| 2012/0324980 A1 | 12/2012 | Nguyen et al. |
| 2013/0290920 A1* | 10/2013 | Borkovic et al. ............. 716/108 |

* cited by examiner

ELECTRONIC SYSTEM WITH MULTI-CYCLE SIMULATION COVERAGE MECHANISM AND METHOD OF OPERATION THEREOF

CROSS-REFERENCE TO RELATED APPLICATION

This application claims the benefit of U.S. Provisional Patent Application Ser. No. 61/914,077, filed Dec. 10, 2013, and the subject matter thereof is incorporated herein by reference thereto.

TECHNICAL FIELD

An embodiment relates generally to an electronic system, and more particularly to a system for simulation involving multi-cycle paths.

BACKGROUND

Modern consumer and industrial electronic devices require reliable operation of devices within them. These devices can be electronic systems, such as notebook computers, desktop computers, smartphones, servers, televisions, and projectors, and are providing increasing levels of functionality to support modern life.

The functionality and reliability of these devices depend and the reliability and design of the circuits performing the functions for these devices. Research and development in the existing technologies can take a myriad of different directions to increase reliability.

DETAILED DESCRIPTION

Figure 1:
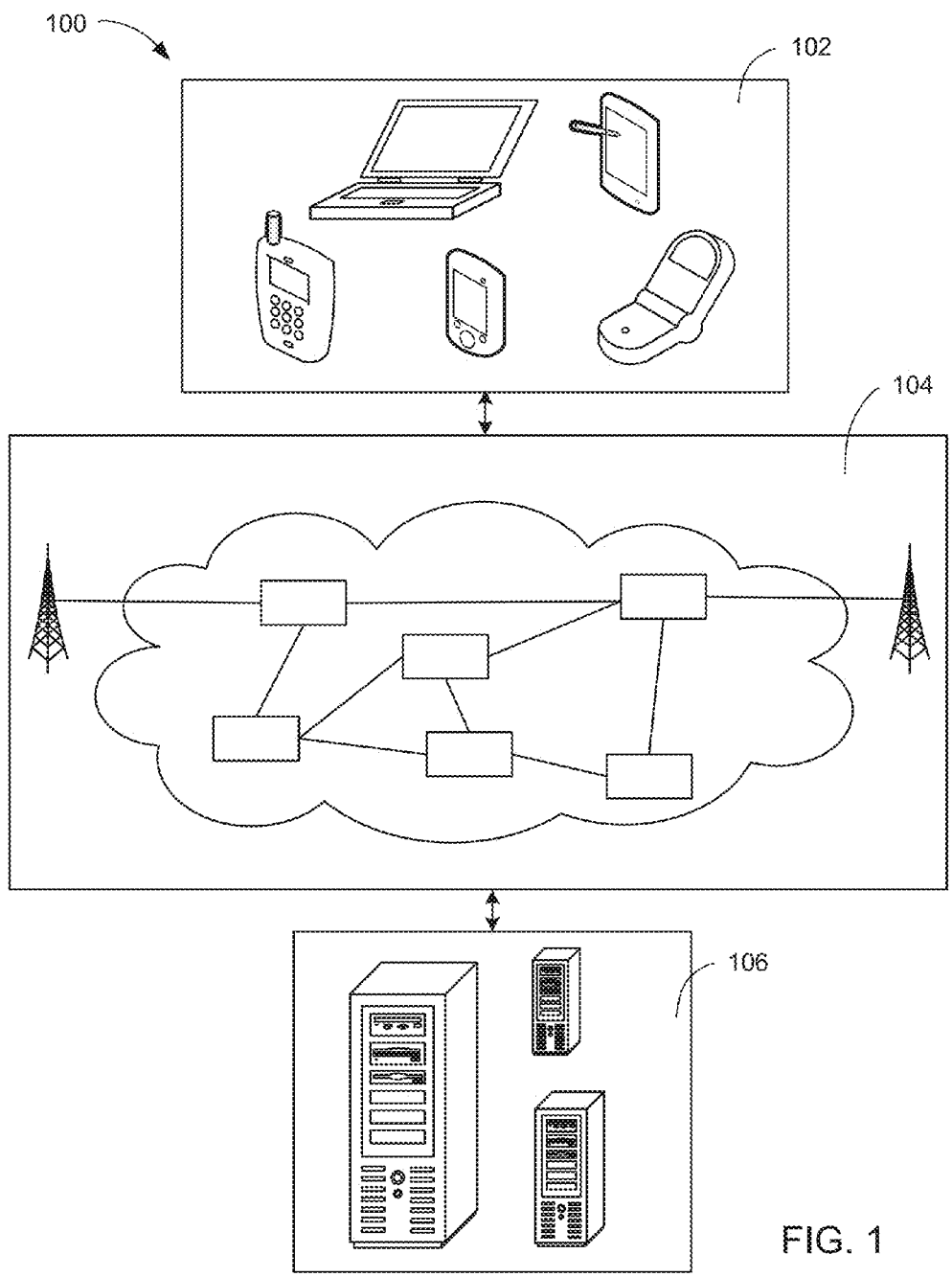
FIG. 1 is an electronic system as an embodiment.

A need still remains for an electronic system with multi-cycle simulation coverage mechanism for providing a robust device design. In view of the ever-increasing commercial competitive pressures, along with growing consumer expectations and the diminishing opportunities for meaningful product differentiation in the marketplace, it is increasingly critical that answers be found to these problems. Additionally, the need to reduce costs, improve efficiencies and performance, and meet competitive pressures adds an even greater urgency to the critical necessity for finding answers to these problems.

Solutions to these problems have been long sought but prior developments have not taught or suggested any solutions and, thus, solutions to these problems have long eluded those skilled in the art.

Certain embodiments have other steps or elements in addition to or in place of those mentioned above. The steps or elements will become apparent to those skilled in the art from a reading of the following detailed description when taken with reference to the accompanying drawings.

The following embodiments are described in sufficient detail to enable those skilled in the art to make and use the embodiment. It is to be understood that other embodiments would be evident based on the present disclosure, and that system, process, or mechanical changes may be made without departing from the scope of an embodiment.

In the following description, numerous specific details are given to provide a thorough understanding of the embodiment. However, it will be apparent that the embodiment can be practiced without these specific details. In order to avoid obscuring an embodiment, some well-known circuits, system configurations, and process steps are not disclosed in detail.

The drawings showing embodiments of the system are semi-diagrammatic, and not to scale and, particularly, some of the dimensions are for the clarity of presentation and are shown exaggerated in the drawing figures. Similarly, although the views in the drawings for ease of description generally show similar orientations, this depiction in the figures is arbitrary for the most part. Generally, the embodiment can be operated in any orientation. The embodiments have been numbered first embodiment, second embodiment, etc. as a matter of descriptive convenience and are not intended to have any other significance or provide limitations for an embodiment.

The term "module" referred to herein can include software, hardware, or a combination thereof in an embodiment in accordance with the context in which the term is used. For example, the software can be machine code, firmware, embedded code, and application software. Also for example, the hardware can be circuitry, processor, computer, integrated circuit, integrated circuit cores, a pressure sensor, an inertial sensor, a microelectromechanical system (MEMS), passive devices, or a combination thereof.

Referring now to FIG. 1, therein is shown an electronic system 100 with multi-cycle coverage mechanism in an embodiment of the present invention. The electronic system 100 can represent an apparatus for the embodiment. An embodiment of the electronic system 100 includes a first device 102, such as a client or a server, connected to a second device 106, such as a client or server. The first device 102 can communicate with the second device 106 with a communication path 104, such as a wireless or wired network. Embodiments of the electronic system 100 can operate the modules described in FIG. 5 within the first device 102, the second device 106, the communication path 104, or a combination thereof.

For example, the first device 102 can be of a variety of devices, such as a computer terminal, a workstation, a desktop computer, a notebook computer, a computer tablet, or a smartphone. The first device 102 can couple, either directly or indirectly, to the communication path 104 to communicate with the second device 106 or can be a stand-alone device.

For illustrative purposes, the electronic system 100 is described with the first device 102 as a client device, although it is understood that the first device 102 can be different types of devices. For example, the first device 102 can also be a server or computer blade.

The second device 106 can be any of a variety of centralized or decentralized computing devices. For example, the second device 106 can be a laptop computer, a desktop computer, grid-computing resources, a virtualized computer resource, cloud computing resource, routers, switches, peer-to-peer distributed computing devices, or a combination thereof.

The second device 106 can be centralized in a single room, distributed across different rooms, distributed across different geographical locations, embedded within a telecommunications network. The second device 106 can couple with the communication path 104 to communicate with the first device 102.

For illustrative purposes, the electronic system 100 is described with the second device 106 as a computing device, although it is understood that the second device 106 can be different types of devices. Also for illustrative purposes, the electronic system 100 is shown with the second device 106 and the first device 102 as end points of the communication path 104, although it is understood that the electronic system 100 can have a different partition between the first device 102, the second device 106, and the communication path 104. For example, the first device 102, the second device 106, or a combination thereof can also function as part of the communication path 104.

The communication path 104 can span and represent a variety of networks and network topologies. For example, the communication path 104 can include wireless communication, wired communication, optical, ultrasonic, or the combination thereof. Satellite communication, cellular communication, Bluetooth, Infrared Data Association standard (lrDA), wireless fidelity (WiFi), and worldwide interoperability for microwave access (WiMAX) are examples of wireless communication that can be included in the communication path 104. Ethernet, digital subscriber line (DSL), fiber to the home (FTTH), and plain old telephone service (POTS) are examples of wired communication that can be included in the communication path 104. Further, the communication path 104 can traverse a number of network topologies and distances. For example, the communication path 104 can include direct connection, personal area network (PAN), local area network (LAN), metropolitan area network (MAN), wide area network (WAN), or a combination thereof.

Figure 2:
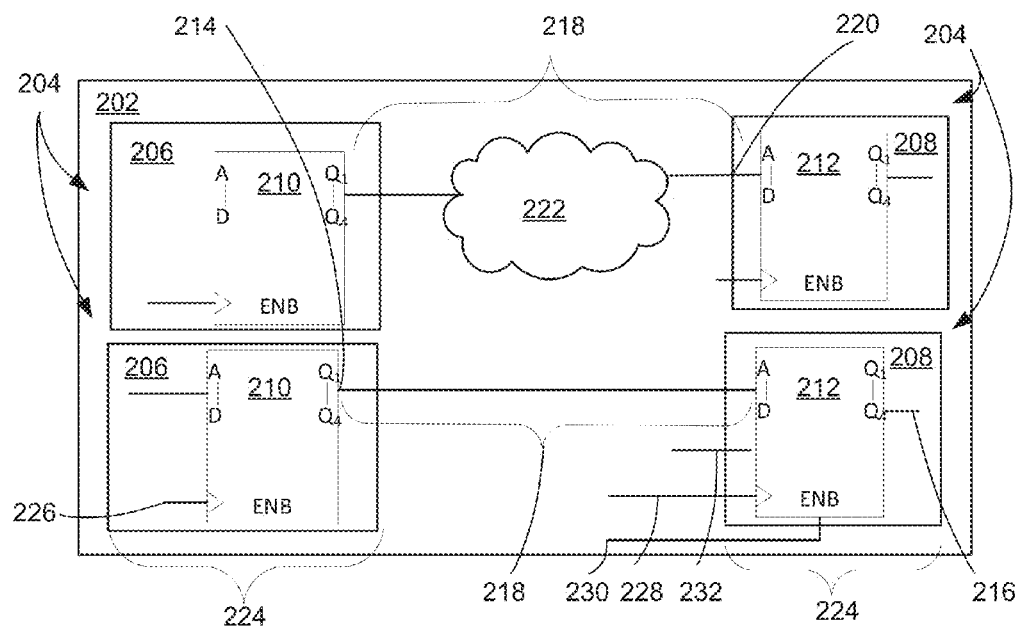
FIG. 2 is a block diagram for a portion of a device.

Referring now to FIG. 2, therein is shown a block diagram for a portion of a device 202. An embodiment of the electronic system 100 can operate with a representation of the device 202. The device 202 is a component or a product being tested and verified with the electronic system 100. As examples, the device 202 can be an integrated circuit chip, an ASIC, a microprocessor, an optical device, or a combination thereof.

As an example, FIG. 2 depicts design blocks 204 as part of the device 202. Each of the design blocks 204 represents a functional or hierarchical partition for a portion of the device 202. The partition of the design blocks 204 can be an abstraction not reflecting the actual physical partition within the device 202 or it can also represent the actual physical partition within the device 202. As examples, the design blocks 204 can represent functional blocks, design cores, hard macros, or a combination thereof in a hierarchy of the device 202.

The design blocks 204 can include source blocks 206 communicating to destination blocks 208. In this example, one of the source blocks 206 sends information or signals to at least one of the destination blocks 208.

The source blocks 206 are not limited to sending information or signals and can receive information or signals. Similarly, the destination blocks 208 are not limited to receiving information or signals and can send information or signals. The terms "source" and "destination" used in this application are for clarity and brevity for the description of the example depicted in FIG. 2 are not intended to be limiting the functionality or the directionality.

Continuing with the example, each of the source blocks 206 and the destination blocks 208 can have a source element 210 and a destination element 212, respectively. The source element 210 is an active circuit that provides a source output 214 from the source blocks 206. The destination element 212 is an active circuit receiving the information or signals into the destination blocks 208. The destination element 212 can also provide a destination output 216. Examples of the source element 210, the destination element 212, or a combination thereof can be a register, a flip-flop, a transistor, or a combination thereof.

A path 218 is the connection between the source element 210 and the destination element 212. The path 218 can include passive interconnects 220 or can also include active circuits 222. For example, the passive interconnects 220 can be routing, such as polysilicon, copper, tungsten, between active circuits. The path 218 can also include, as examples, the active circuits 222, such as logic gates, repeater circuits, buffer circuits, or a combination thereof.

Each of the source blocks 206, the destination blocks 208, or a combination thereof can represent different domains 224 within the device 202. For example, the device 202 can include the source blocks 206 in one clock domain running off a source clock 226 and the destination blocks 208 in a different clock domain running off a destination clock 228. In this example, the source clock 226 can clock the outputs from the source element 210 while the destination clock 228 can clock the inputs into the destination element 212.

As examples, the source blocks 206 can include different clocks from one another and within each. The destination blocks 208 can also include different clocks from one another and within each.

The source element 210, the destination element 212, or a combination thereof in the source blocks 206, the destination blocks 208, or a combination thereof can also be connected to an operational reset 230. The operational reset 230 can be used to reset the device 202 including the source blocks 206 and the destination blocks 208. The operational reset 230 can be a power-on reset, other forms of hard reset, or a soft reset for the device 202 or some of the design blocks 204.

For illustrative purposes, the device 202 is described with the operational reset 230, the source clock 226, and the destination clock 228 as a singular signal, although it is understood that other embodiments can have a different number of resets and clocks. For example, different resets or clocks can go to the each of the source blocks 206, the destination blocks 208, or a combination thereof differently than the other blocks.

The source element 210, the destination element 212, or a combination thereof can also include inputs for enable signals 232. The enable signals 232 can function similarly to a gated clock, which generates a non-clock signal.

Figure 3:
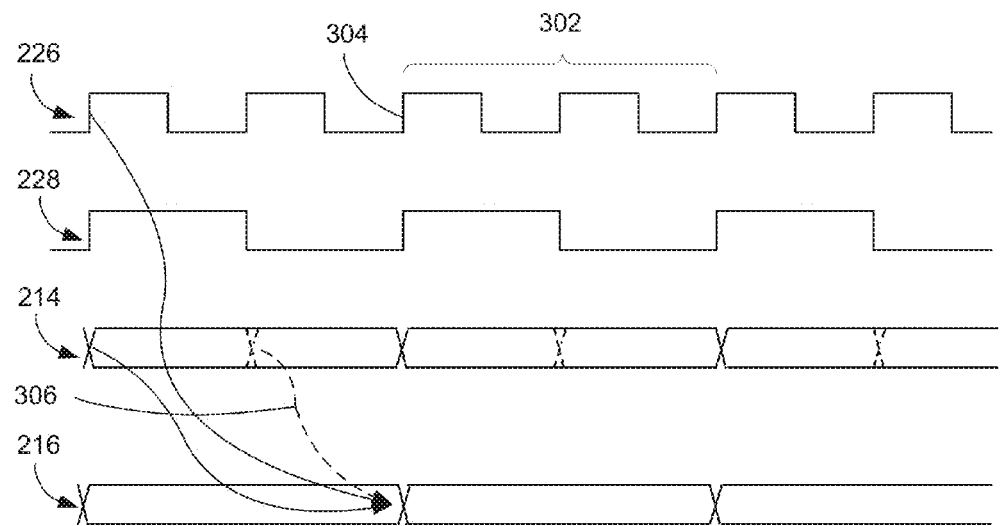
FIG. 3 is an example timing diagram of the block diagram of FIG. 2.

Referring now to FIG. 3, therein is shown an example timing diagram of the block diagram of FIG. 2. The timing diagram depicts the source clock 226 followed by the destination clock 228, the source output 214, and the destination output 216. In this example, the destination clock 228 has a relationship with the source clock 226 where the destination clock 228 is shown as half the frequency of the source clock 226.

For illustrative purposes, the device 202 of FIG. 2 is described with the destination clock 228 having particular relationship with the source clock 226, although it is understood that the relationship can be different. For example, the destination clock 228 and the source clock 226 can be non-integer multiples of one another. Also for example, the destination clock 228 can have a faster frequency than the source clock 226.

The timing diagram also depicts a multi-cycle exception 302 between the domains 224 of FIG. 2. In this example, the multi-cycle exception 302 is a multi-cycle clock exception 304 where the source output 214 is supposed to change at multiple cycles of the source clock 226 and not every single cycle, for example at every raising edge of the source clock 226. FIG. 3 depicts that multi-cycle clock exception 304 is two clock cycles of the source clock 226, allowing for the source output 214 to remain stable such that the destination clock 228 can clock that source output 214 and reflect that new input to the destination element 212 of FIG. 2 onto the destination output 216.

A correct function of the source blocks 206 of FIG. 2 and the destination blocks 208 of FIG. 2 is depicted with the solid arrows from the source clock 226 and the source output 214 to the next transition depicted on the destination output 216. In a violation 306 of the multi-cycle exception 302, or as a more specific example the multi-cycle clock exception 304, the source output 214 is changing at the next clock cycle of the source clock 226, as depicted by the dashed transition on the source output 214. The violation 306 causes the destination element 212 to input the incorrect information and input the source output 214, which violated the multi-cycle exception 302, and this is depicted with a dashed arrow from the source output 214 to the destination output 216.

Figure 4:
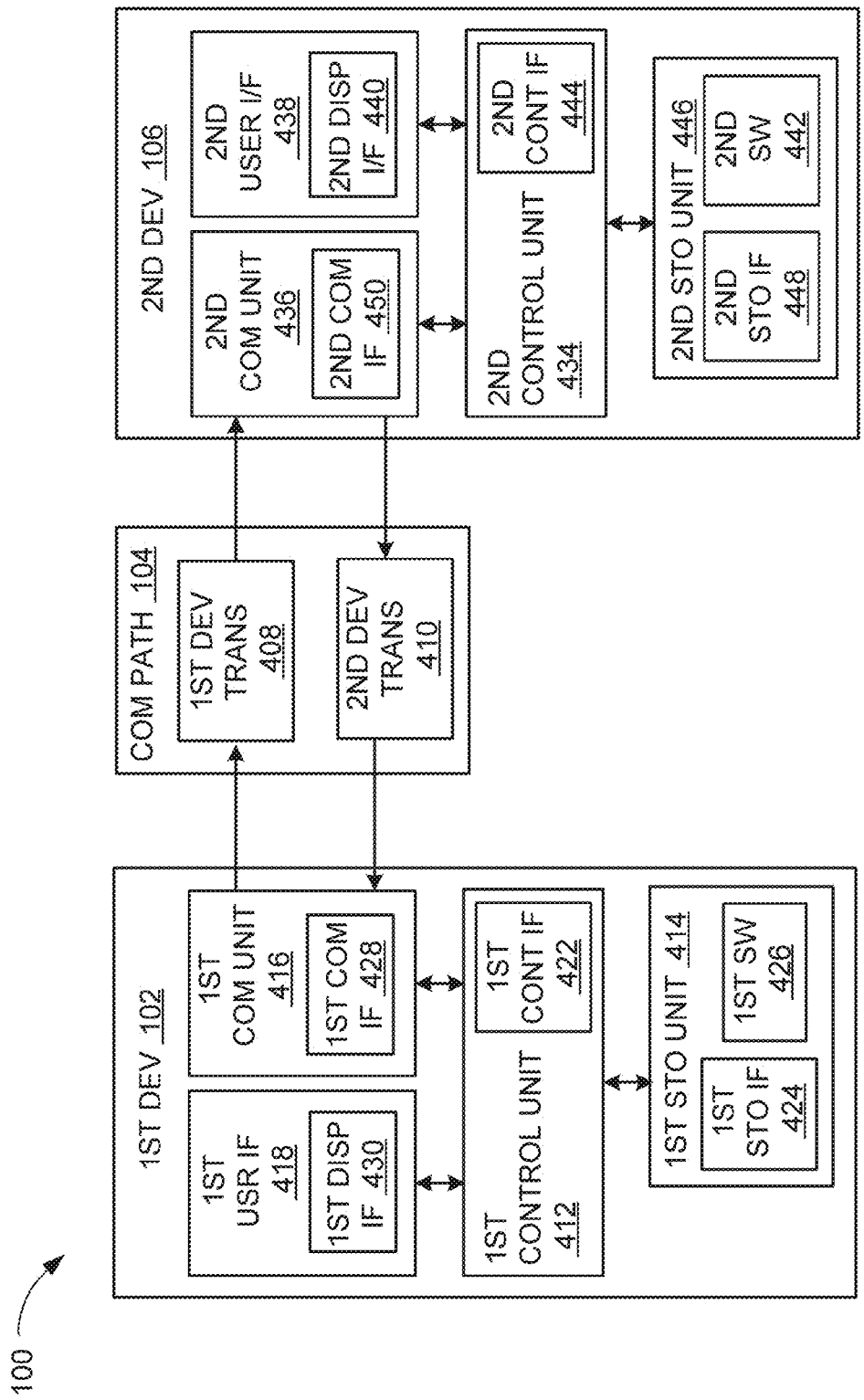
FIG. 4 is an example block diagram of the electronic system as an embodiment.

Referring now to FIG. 4, therein is shown an example block diagram of the electronic system 100 as an embodiment. The electronic system 100 can include the first device 102, the communication path 104, and the second device 106. The first device 102 can send information in a first device transmission 408 over the communication path 104 to the second device 106. The second device 106 can send information in a second device transmission 410 over the communication path 104 to the first device 102.

For illustrative purposes, the electronic system 100 is shown with the first device 102 as a client device, although it is understood that the electronic system 100 can have the first device 102 as a different type of device. For example, the first device 102 can be a server having a display interface.

Also for illustrative purposes, the electronic system 100 is shown with the second device 106 as a server, although it is understood that the electronic system 100 can have the second device 106 as a different type of device. For example, the second device 106 can be a client device.

For brevity of description in embodiments, the first device 102 will be described as a client device and the second device 106 will be described as a server device. Embodiments are not limited to this selection for the type of devices and are examples of the embodiments.

The first device 102 can include a first control unit 412, a first storage unit 414, a first communication unit 416, and a first user interface 418. The first control unit 412 can include a first control interface 422. The first control unit 412 can execute a first software 426 to provide the intelligence of the electronic system 100.

The first control unit 412 can be implemented in a number of different manners. For example, the first control unit 412 can be a processor, an application specific integrated circuit (ASIC) an embedded processor, a microprocessor, a hardware control logic, a hardware finite state machine (FSM), a digital signal processor (DSP), or a combination thereof. The first control interface 422 can be used for communication between the first control unit 412 and other functional units in the first device 102. The first control interface 422 can also be used for communication that is external to the first device 102.

The first control interface 422 can receive information from the other functional units or from external sources, or can transmit information to the other functional units or to external destinations. The external sources and the external destinations refer to sources and destinations external to the first device 102.

The first control interface 422 can be implemented in different ways and can include different implementations depending on which functional units or external units are being interfaced with the first control interface 422. For example, the first control interface 422 can be implemented with a microelectromechanical system (MEMS), optical circuitry, waveguides, wireless circuitry, wireline circuitry, or a combination thereof.

The first storage unit 414 can store the first software 426. The first storage unit 414 can also store the relevant information, such as data representing incoming images, data representing previously presented image, sound files, or a combination thereof.

The first storage unit 414 can be a volatile memory, a nonvolatile memory, an internal memory, an external memory, or a combination thereof. For example, the first storage unit 414 can be a nonvolatile storage such as nonvolatile random access memory (NVRAM), Flash memory, disk storage, or a volatile storage such as static random access memory (SRAM).

The first storage unit 414 can include a first storage interface 424. The first storage interface 424 can be used for communication between and other functional units in the first device 102. The first storage interface 424 can also be used for communication that is external to the first device 102.

The first storage interface 424 can receive information from the other functional units or from external sources, or can transmit information to the other functional units or to external destinations. The external sources and the external destinations refer to sources and destinations external to the first device 102.

The first storage interface 424 can include different implementations depending on which functional units or external units are being interfaced with the first storage unit 414. The first storage interface 424 can be implemented with technologies and techniques similar to the implementation of the first control interface 422.

The first communication unit 416 can enable external communication to and from the first device 102. For example, the first communication unit 416 can permit the first device 102 to communicate with the second device 106 of FIG. 1, an attachment, such as a peripheral device or a computer desktop, and the communication path 104.

The first communication unit 416 can also function as a communication hub allowing the first device 102 to function as part of the communication path 104 and not limited to be an end point or terminal unit to the communication path 104. The first communication unit 416 can include active and passive components, such as microelectronics or an antenna, for interaction with the communication path 104.

The first communication unit 416 can include a first communication interface 428. The first communication interface 428 can be used for communication between the first communication unit 416 and other functional units in the first device 102. The first communication interface 428 can receive information from the other functional units or can transmit information to the other functional units.

The first communication interface 428 can include different implementations depending on which functional units are being interfaced with the first communication unit 416. The first communication interface 428 can be implemented with technologies and techniques similar to the implementation of the first control interface 422.

The first user interface 418 allows a user (not shown) to interface and interact with the first device 102. The first user interface 418 can include an input device and an output device. Examples of the input device of the first user interface 418 can include a keypad, a touchpad, soft-keys, a keyboard, a microphone, an infrared sensor for receiving remote signals, or any combination thereof to provide data and communication inputs.

The first user interface 418 can include a first display interface 430. The first display interface 430 can include a display, a projector, a video screen, a speaker, or any combination thereof.

The first control unit 412 can operate the first user interface 418 to display information generated by the electronic system 100. The first control unit 412 can also execute the first software 426 for the other functions of the electronic system 100. The first control unit 412 can further execute the first software 426 for interaction with the communication path 104 via the first communication unit 416.

The second device 106 can be optimized for implementing an embodiment of the present invention in a multiple device embodiment with the first device 102. The second device 106 can provide the additional or higher performance processing power compared to the first device 102. The second device 106 can include a second control unit 434, a second communication unit 436, and a second user interface 438.

The second user interface 438 allows a user (not shown) to interface and interact with the second device 106. The second user interface 438 can include an input device and an output device. Examples of the input device of the second user interface 438 can include a keypad, a touchpad, soft-keys, a keyboard, a microphone, or any combination thereof to provide data and communication inputs. Examples of the output device of the second user interface 438 can include a second display interface 440. The second display interface 440 can include a display, a projector, a video screen, a speaker, or any combination thereof.

The second control unit 434 can execute a second software 442 to provide the intelligence of the second device 106 of the electronic system 100. The second software 442 can operate in conjunction with the first software 426. The second control unit 434 can provide additional performance compared to the first control unit 412.

The second control unit 434 can operate the second user interface 438 to display information. The second control unit 434 can also execute the second software 442 for the other functions of the electronic system 100, including operating the second communication unit 436 to communicate with the first device 102 over the communication path 104.

The second control unit 434 can be implemented in a number of different manners. For example, the second control unit 434 can be a processor, an embedded processor, a microprocessor, hardware control logic, a hardware finite state machine (FSM), a digital signal processor (DSP), or a combination thereof.

The second control unit 434 can include a second controller interface 444. The second controller interface 444 can be used for communication between the second control unit 434 and other functional units in the second device 106. The second controller interface 444 can also be used for communication that is external to the second device 106.

The second controller interface 444 can receive information from the other functional units or from external sources, or can transmit information to the other functional units or to external destinations. The external sources and the external destinations refer to sources and destinations external to the second device 106.

The second controller interface 444 can be implemented in different ways and can include different implementations depending on which functional units or external units are being interfaced with the second controller interface 444. For example, the second controller interface 444 can be implemented with a pressure sensor, an inertial sensor, a microelectromechanical system (MEMS), optical circuitry, waveguides, wireless circuitry, wireline circuitry, or a combination thereof.

A second storage unit 446 can store the second software 442. The second storage unit 446 can also store the such as data representing incoming images, data representing previously presented image, sound files, or a combination thereof. The second storage unit 446 can be sized to provide the additional storage capacity to supplement the first storage unit 414.

For illustrative purposes, the second storage unit 446 is shown as a single element, although it is understood that the second storage unit 446 can be a distribution of storage elements. Also for illustrative purposes, the electronic system 100 is shown with the second storage unit 446 as a single hierarchy storage system, although it is understood that the electronic system 100 can have the second storage unit 446 in a different configuration. For example, the second storage unit 446 can be formed with different storage technologies forming a memory hierarchal system including different levels of caching, main memory, rotating media, or off-line storage.

The second storage unit 446 can be a volatile memory, a nonvolatile memory, an internal memory, an external memory, or a combination thereof. For example, the second storage unit 446 can be a nonvolatile storage such as nonvolatile random access memory (NVRAM), Flash memory, disk storage, or a volatile storage such as static random access memory (SRAM).

The second storage unit 446 can include a second storage interface 448. The second storage interface 448 can be used for communication between other functional units in the second device 106. The second storage interface 448 can also be used for communication that is external to the second device 106.

The second storage interface 448 can receive information from the other functional units or from external sources, or can transmit information to the other functional units or to external destinations. The external sources and the external destinations refer to sources and destinations external to the second device 106.

The second storage interface 448 can include different implementations depending on which functional units or external units are being interfaced with the second storage unit 446. The second storage interface 448 can be implemented with technologies and techniques similar to the implementation of the second controller interface 444.

The second communication unit 436 can enable external communication to and from the second device 106. For example, the second communication unit 436 can permit the second device 106 to communicate with the first device 102 over the communication path 104.

The second communication unit 436 can also function as a communication hub allowing the second device 106 to function as part of the communication path 104 and not limited to be an end point or terminal unit to the communication path 104. The second communication unit 436 can include active and passive components, such as microelectronics or an antenna, for interaction with the communication path 104.

The second communication unit 436 can include a second communication interface 450. The second communication interface 450 can be used for communication between the second communication unit 436 and other functional units in the second device 106. The second communication interface 450 can receive information from the other functional units or can transmit information to the other functional units.

The second communication interface 450 can include different implementations depending on which functional units are being interfaced with the second communication unit 436. The second communication interface 450 can be implemented with technologies and techniques similar to the implementation of the second controller interface 444.

The first communication unit 416 can couple with the communication path 104 to send information to the second device 106 in the first device transmission 408. The second device 106 can receive information in the second communication unit 436 from the first device transmission 408 of the communication path 104.

The second communication unit 436 can couple with the communication path 104 to send information to the first device 102 in the second device transmission 410. The first device 102 can receive information in the first communication unit 416 from the second device transmission 410 of the communication path 104. The electronic system 100 can be executed by the first control unit 412, the second control unit 434, or a combination thereof. For illustrative purposes, the second device 106 is shown with the partition having the second user interface 438, the second storage unit 446, the second control unit 434, and the second communication unit 436, although it is understood that the second device 106 can have a different partition. For example, the second software 442 can be partitioned differently such that some or all of its function can be in the second control unit 434 and the second communication unit 436. Also, the second device 106 can include other functional units not shown in FIG. 4 for clarity.

The functional units in the first device 102 can work individually and independently of the other functional units. The first device 102 can work individually and independently from the second device 106 and the communication path 104.

The functional units in the second device 106 can work individually and independently of the other functional units. The second device 106 can work individually and independently from the first device 102 and the communication path 104.

For illustrative purposes, the electronic system 100 is described by operation of the first device 102 and the second device 106. It is understood that the first device 102 and the second device 106 can operate any of the modules and functions of the electronic system 100. As a more specific example, the first control unit 412, the second control unit 434, or a combination thereof can execute the modules described in FIG. 5 as part of the first software 426, the second software 442, or a combination thereof.

Figure 5:
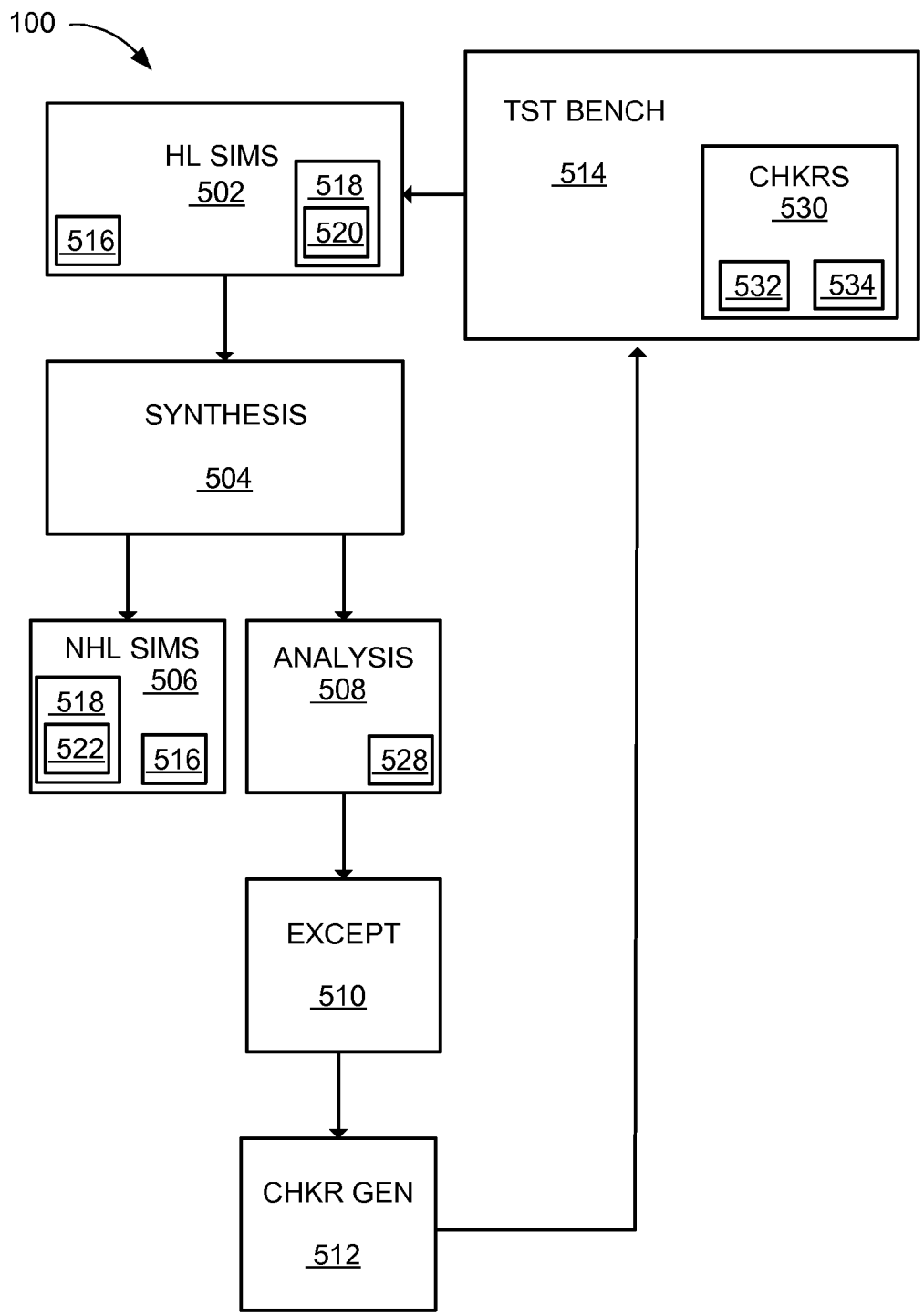
FIG. 5 is a control flow of an embodiment of the electronic system.

Referring now to FIG. 5, therein is shown a control flow of an embodiment of the electronic system 100. As an example, the control flow depicts a high level simulation module 502, a synthesis module 504, a non-high level simulation module 506, an analysis module 508, an exception module 510, a checker generation module 512, and a test bench 514.

The high level simulation module 502 provides the capability to run verification simulations for the device 202 of FIG. 2. The first storage unit 414 of FIG. 4, the second storage unit 446 of FIG. 4, or a combination thereof can provide a device design 516 as a representation of the device 202. The high level simulation module 502 operates with a simulation version 518 of the device design 516. The simulation version 518 is a representation of the device design 516 where the high level simulation module 502 can read, interpret, and run verification simulations to validate the functionality of the device design 516.

The simulation version 518 can be represented as a high level description language design 520 where the device design 516 is captured in or represented with a high-level description language (HDL), such as Verilog, Very high speed integrated circuit Hardware Description Language (VHDL), Analog Hardware Description Language (AHDL), or a combination thereof. As a more specific example, the high level description language design 520 can be represented with a register transfer language (RTL). Examples of the high level simulation module 502 can be a Verilog simulation tool, a VHDL simulation tool, an AHDL simulation tool, or a combination thereof. The flow can progress from the high level simulation module 502 to the synthesis module 504.

The synthesis module 504 converts the device design 516 to a non-high level description language design 522 from the high level description language design 520. The non-high level description language design 522 differs from the high level description language design 520 in that the non-high level version provides less abstraction for functionality and provides additional physical details of how the device design 516 will be implemented physically. For example, the non-high level description language design 522 can be represented by a Spice deck, a gate level netlist, or other functional models with timing information for the design blocks 204 of FIG. 2, including the source blocks 206 of FIG. 2 or the destination blocks 208 of FIG. 2.

The synthesis module 504 can convert the device design 516 to the non-high level description language design 522 in a number of ways. For example, the synthesis module 504 can utilize technology files to help map the high level description language design 520 to the non-high level description language design 522. The technology files can include circuits, logic gates, memory, functional macros, or a combination thereof and associated timing for these circuits for a target design or process node for the device design 516. The technology files can also represent a generic mapping into circuits and gate without being tied to a specific process node or library. The technology files can also include estimated routing information, such as timing, load, delays, lengths, where the routing information can be used to model the interconnects between the circuit elements in the non-high level description language design 522. The non-high level description language design 522 can also represent the simulation version 518 for the device design 516.

The flow can progress with a number of directions. For example, the flow can progress from the synthesis module 504 to the non-high level simulation module 506. The flow can also progress to the analysis module 508.

The non-high level simulation module 506 provides the capability to run verification simulations for the device 202 using the simulation version 518 as the non-high level description language design 522. The non-high level simulation module 506 can also utilize technology files modeling at least some details of the physical implementations. The details can be similar to the details found in the technology files used by the synthesis module 504 but the files can be different. The additional details often require more computing resources from the electronic system 100 to run the non-high level simulation on the non-high level description language design 522. The flow can progress from the non-high level simulation module 506 to other functions (not shown for brevity) to prepare the device design 516 for fabrication to a physical implementation of the device 202.

Continuing now with the analysis module 508, this module determines whether the device design 516 includes the multi-cycle exception 302 of FIG. 3. The analysis module 508 can identify different types of the multi-cycle exception 302.

For example, the analysis module 508 can identify the multi-cycle clock exception 304 of FIG. 3. As a further example, the analysis module 508 can identify multi-cycle exception 302 for non-clock signals used as an input to the clock input of the source element 210 of FIG. 2, the destination element 212 of FIG. 2, or a combination thereof.

A clock signal typically provides a free running signal at a fixed frequency or period during normal operation of the device 202. A non-clock signal will be non-free running, varying frequency or period, or a combination thereof during normal operation of the device 202. The non-clock signal can be a gated clock signal where the gating can be done by an enable signal, as an example, and not considered as part of a clock distribution scheme or mechanism for the device 202 or the device design 516.

The analysis module 508 can identify the multi-cycle exception 302 based on the enable signals 232 of FIG. 2 to the source element 210, the destination element 212, or a combination thereof. The enable signals 232 to the source element 210 or the destination element 212 allow for only clock signals to be tied to the clock input while still prohibiting or allowing the functionality of the source element 210 or the destination element 212.

The analysis module 508 can determine the multi-cycle exception 302 in a number ways and can depend on the type of the multi-cycle exception 302. For example, for the multi-cycle clock exception 304, the analysis module 508 searches whether the domains 224 exists in the device design 516 by searching whether different signals are tied the clock input to specified elements or serve as a clock.

If the analysis module 508 operates with the simulation version 518 as the non-high level description language design 522, the analysis module 508 can identify which signals are tied to the clock input of flip-flops, such as the source element 210 or the destination element 212 shown in FIG. 2. As a more general description, the technology files used by the synthesis module 504, the non-high level simulation module 506, or a combination thereof can include circuit elements with attributes associated with terminals to each of the circuit elements. The attributes can be used to identify clock input terminals for each of the circuit elements.

If the clock signals differ between the source blocks 206 of FIG. 2 or the destination blocks 208 of FIG. 2, then the analysis module 508 determines that the device design 516 includes the domains 224 with different clocks or clock domains. The determination of different clocks can differentiate simple buffering of clock signals and clock distribution within the device design 516 versus a divide of a clock frequency, a phase shift, or an asynchronous clock, as examples.

If the analysis module 508 operates with the simulation version 518 as the high-level description language design 526, the analysis module 508 can identify which signals are structurally coded to function as a clock signal. The identification can be made by searching for the syntax and structure of the HDL. As an example, the high level description language design 520 coded in Verilog can include code structure and syntax as: "always@(posedge clk) . . . " where the "always" can be interpreted as a continuing running function during a Verilog simulation and the invocation of the functionality is at ("@"), a positive edge ("posedge") of a clock ("clk"). The "clk" in this example can be the source clock 226 of FIG. 2 or the destination clock 228 of FIG. 2.

The analysis module 508 can use a similar approach to identify non-clock signals or enable signals as the multi-cycle exception 302. This identification can be done with either the non-high level description language design 522 or the high level description language design 520.

Whether the analysis module 508 operates on either of the simulation version 518 for the device design 516, the analysis module 508 can identify clocks, the domains 224, and the multi-cycle exception 302 with a vectorless approach. In other words, the determination is not dependent on the simulation vectors being ran with the high level simulation module 502 or the non-high level simulation module 506. The analysis module 508 can also perform static timing analysis. The flow can progress from the analysis module 508 to the exception module 510.

The exception module 510 generates a multi-cycle exception profile 528 for the device design 516. The exception module 510 receives the multi-cycle exception 302 identified by the analysis module 508. The exception module 510 can provide different categories for the multi-cycle exception 302 in the multi-cycle exception profile 528 including the multi-cycle clock exception 304 for clock signals, such as the source clock 226 of FIG. 2 or the destination clock 228 of FIG. 2, non-clock signals, and enable signals.

For illustrative purposes, the flow is depicted as sequential and linear flowing from the analysis module 508 to the exception module 510, although it is understood that additional embodiments can operate differently. For example, the analysis module 508 and the exception module 510 can iterate and loop back between each other while the analysis module 508 identifies each of the multi-cycle exception 302 or for each category.

The exception module 510 identifies the source element 210 from the source blocks 206 and the corresponding destination element 212 in the destination blocks 208. This identification is done for each type of the multi-cycle exception 302 whether for the multi-cycle clock exception 304 for clock signals or non-clock signals as well as for enable signals. The flow can progress from the exception module 510 to the checker generation module 512.

The checker generation module 512 generates checkers 530 to be used during verification simulations of the device design 516. The checker generation module 512 can generate the checkers 530 for the test bench 514. The checkers 530 can be based on the simulation version 518 and the type of simulation.

For example, if the simulation version 518 is for the non-high level description language design 522, then the checker generation module 512 can generate the checkers 530 with the appropriate syntax, element name, and hierarchy to identify the appropriate pair including the source element 210 and the destination element 212. Similarly, if the simulation version 518 is for the high level description language design 520, then the checker generation module 512 can generate the checkers 530 also with appropriate syntax, variable name, and hierarchy to identify the appropriate pair including the source element 210 and the destination element 212.

The checkers 530, in the appropriate form, as well as the test bench 514 can be used with the high level simulation module 502 to verify the device design 516 represented with the high level description language design 520. Similarly, the checkers 530, in the appropriate form, as well as the test bench 514 can also be used with the non-high level simulation module 506 to verify the device design 516 represented with the non-high level description language design 522.

With either type of simulation or the simulation version 518 for the device design 516, the checkers 530 provide a notification function 532 if the violation 306 of FIG. 3 is detected for the multi-cycle exception 302 identified in the multi-cycle exception profile 528. The violation 306 can also be one that can be observed at an external output 534 of the device design 516. The checkers 530 can also inhibit checking or notification of the violation 306 if the device design 516 is undergoing the operational reset 230 of FIG. 2.

It has been discovered that embodiments of the electronic system 100 provides increased simulation coverage for the multi-cycle exception 302 for the device design 516 by generating the checkers 530 with the analysis module 508 and using the checkers 530 with high level simulation where the simulation time is faster than running gate level simulations, e.g. non-high level simulation. The increased simulation coverage improves the reliability and robustness of the device design 516 before fabrication.

The electronic system 100 has been described with module functions or order as an example. The electronic system 100 can partition the modules differently or order the modules differently. For example, the checkers 530 can also be applied to the non-high level simulation module 506 or there can be an iterative loop between the analysis module 508 and the exception module 510 as described earlier. As a further example, the analysis module 508 can be applied to the high level description language design 520 and generate the checkers 530 before simulation of the high level description language design 520 and the analysis module 508 does not need to follow the synthesis module 504.

The modules described in this application can be hardware implementation or hardware accelerators in the first control unit 412 of FIG. 4 or in the second control unit 434 of FIG. 4. The modules can also be hardware implementation or hardware accelerators within the first device 102 or the second device 106 but outside of the first control unit 412 or the second control unit 434, respectively, as depicted in FIG. 4. However, it is understood that the first control unit 412, the second control unit 434, or a combination thereof can collectively refer to all hardware accelerators for the modules.

The modules described in this application can be implemented as instructions stored on a non-transitory computer readable medium to be executed by the integrated circuit in the electronic system 100. The non-transitory computer medium can include the memory of the integrated circuit in the electronic system 100. The non-transitory computer readable medium can include non-volatile memory, such as a hard disk drive, non-volatile random access memory (NVRAM), solid-state storage device (SSD), compact disk (CD), digital video disk (DVD), or universal serial bus (USB) flash memory devices. The non-transitory computer readable medium can be integrated as a part of the electronic system 100 or installed as a removable portion of the electronic system 100.

Figure 6:
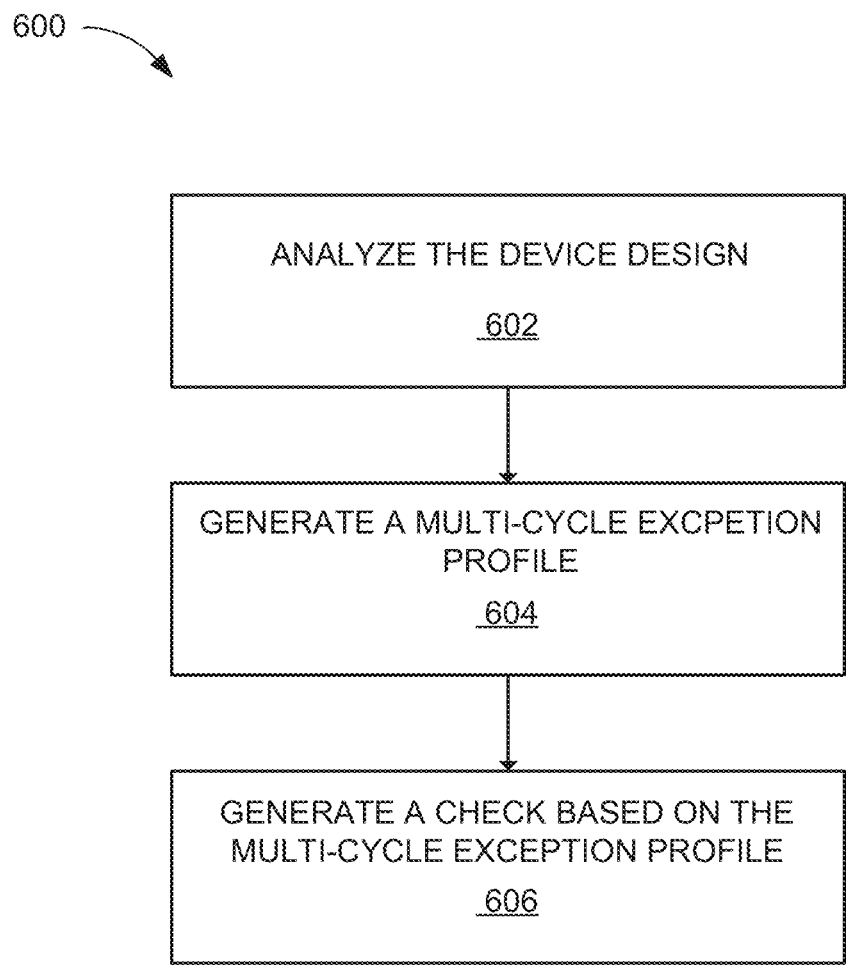
FIG. 6 is a flow chart of a method of operation of an electronic system in an embodiment.

Referring now to FIG. 6, therein is shown a flow chart of a method 600 of operation of an electronic system 100 in an embodiment. The method 600 includes: analyzing a device design for a multi-cycle exception in a block 602; generating a multi-cycle exception profile in a block 604; and generating a checker based on the multi-cycle exception profile for a test bench for a simulation version of the device design in a block 606.

The resulting method, process, apparatus, device, product, and/or system is straightforward, cost-effective, uncomplicated, highly versatile, accurate, sensitive, and effective, and can be implemented by adapting known components for ready, efficient, and economical manufacturing, application, and utilization. Another important aspect of an embodiment is that it valuably supports and services the historical trend of reducing costs, simplifying systems, and increasing performance.

These and other valuable aspects of an embodiment consequently further the state of the technology to at least the next level.

While the embodiment has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters set forth herein or shown in the accompanying drawings are to be interpreted in an illustrative and non-limiting sense.

What is claimed is:

1. An apparatus comprising:
a storage unit configured to provide a device design including a source element and a destination element; and
a control unit configured to:
analyze vectorlessly the device design for a multi-cycle exception,
generate a multi-cycle exception profile including the source element running off a source clock and the destination element running off a destination where the source clock and the destination clock are in different clock domains, and
generate a checker for the source element based on the multi-cycle exception profile for a test bench for a simulation version of the device design.

2. The apparatus as claimed in claim 1 wherein the multi-cycle exception profile includes a multi-cycle clock exception between a source block and a destination block in the device design.

3. The apparatus as claimed in claim 1 wherein the device design comprises a non-high level description language design.

4. The apparatus as claimed in claim 1 wherein the device design comprises a high level description language design.

5. The apparatus as claimed in claim 1 wherein the control unit is further configured to:
analyze the simulation version representing a high level simulation for a high level description language design; and
generate the checker for the test bench for the simulation version also representing the high level simulation for the high level description language design.

6. The apparatus as claimed in claim 1 wherein the simulation version comprises a non-high level description language design.

7. The apparatus as claimed in claim 2 wherein the checker includes a description for a path from the source element in the source block to the destination element in the destination block.

8. The apparatus as claimed in claim 1 wherein the checker includes an operational reset for the device design.

9. The apparatus as claimed in claim 1 wherein the checker includes a notification function that is triggered when a violation of the multi-cycle exception is detected during a simulation of the simulation version.

10. The apparatus as claimed in claim 9 wherein the violation is manifested at an external output of the device design.

11. A method comprising:
analyzing vectorlessly, using a computer having at least one processor, a device design comprising a source element and a destination element for a multi-cycle exception;

generating a multi-cycle exception profile including the source element running off a source clock and the destination element running off a destination clock where the source clock and the destination clock are in different clock domains; and generating a checker for the source element based on the multi-cycle exception profile for a test bench for a simulation version of the device design.

12. The method as claimed in claim 11 wherein the multi-cycle exception profile includes a multi-cycle clock exception between a source block and a destination block in the device design.

13. The method as claimed in claim 11 wherein the device design comprises a non-high level description language design.

14. The method as claimed in claim 11 wherein the device design comprises a high level description language design.

15. The method as claimed in claim 11 wherein:

analyzing vectorlessly the device design includes analyzing the simulation version representing a high level simulation for a high level description language design; and generating the checker includes generating the checker for the test bench for the simulation version also representing the high level simulation for the high level description language design.

16. The method as claimed in claim 11 wherein the simulation version comprises a non-high level description language design.

17. The method as claimed in claim 12 wherein the checker includes a description for a path from the source element in the source block to the destination element in the destination block.

18. The method as claimed in claim 11 wherein the checker includes an operational reset for the device design.

19. The method as claimed in claim 11 wherein the checker includes a notification function when a violation of the multi-cycle exception is detected during a simulation of the simulation version.

20. The method as claimed in claim 19 wherein the violation is manifested at an external output of the device design.

21. A non-transitory computer readable medium including instructions for execution, by a computer, the instructions comprising instructions for:

analyzing vectorlessly a device design comprising a source element and a destination element for a multi-cycle exception, generating a multi-cycle exception profile including the source element running off a source clock and the destination element running off a destination clock where the source clock and the destination dock are in different clock domains, and generating a checker for the source element based on the multi-cycle exception profile for a test bench for a simulation version of the device design.

22. The medium as claimed in claim 21 wherein the multi-cycle exception profile includes a multi-cycle clock exception between a source block and a destination block in the device design.

23. The medium as claimed in claim 21 wherein the device design comprises a non-high level description language design.

24. The medium as claimed in claim 21 wherein the device design comprises a high level description language design.

25. The medium as claimed in claim 21 wherein:

analyzing vectorlessly the device design includes analyzing the simulation version representing a high level simulation for a high level description language design; and generating the checker includes generating the checker for the test bench for the simulation version also representing the high level simulation for the high level description language design.

26. The medium as claimed in claim 21 wherein the simulation version comprises a non-high level description language design.

27. The medium as claimed in claim 22 wherein the checker includes a description for a path from the source element in the source block to the destination element in the destination block.

28. The medium as claimed in claim 21 wherein the checker includes an operational reset for the device design.

29. The medium as claimed in claim 21 wherein the checker includes a notification function when a violation of the multi-cycle exception is detected during a simulation of the simulation version.

30. The medium as claimed in claim 29 wherein the violation is manifested at an external output of the device design.

* * * * *